United States Patent
Gadamsetty

(10) Patent No.: US 11,942,171 B2
(45) Date of Patent: Mar. 26, 2024

(54) CONCURRENT COMPENSATION IN A MEMORY SYSTEM

(71) Applicant: MICRON TECHNOLOGY, INC., Boise, ID (US)

(72) Inventor: Harish V. Gadamsetty, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/590,679

(22) Filed: Feb. 1, 2022

(65) Prior Publication Data

US 2023/0207033 A1     Jun. 29, 2023

Related U.S. Application Data

(60) Provisional application No. 63/294,735, filed on Dec. 29, 2021.

(51) Int. Cl.
| | |
|---|---|
| *G11C 29/02* | (2006.01) |
| *G11C 7/10* | (2006.01) |
| *G11C 7/20* | (2006.01) |
| *G11C 8/06* | (2006.01) |
| *G11C 29/00* | (2006.01) |
| *G11C 29/18* | (2006.01) |

(52) U.S. Cl.
CPC .......... *G11C 29/026* (2013.01); *G11C 7/1039* (2013.01); *G11C 7/20* (2013.01); *G11C 8/06* (2013.01); *G11C 29/789* (2013.01); *G11C 2029/1802* (2013.01)

(58) Field of Classification Search
CPC ....... G11C 29/026; G11C 7/1039; G11C 7/20; G11C 8/06; G11C 29/789; G11C 2029/1802
See application file for complete search history.

(56) References Cited

U.S. PATENT DOCUMENTS 9,349,491 B1   5/2016  Morgan et al.
9,805,828 B1  10/2017  Yoko
(Continued)

OTHER PUBLICATIONS

U.S. Appl. No. 17/350,305 titled "Concurrent Compensation in a Memory System" filed Jun. 17, 2021, pp. all.

*Primary Examiner* — Mohammed A Bashar
(74) *Attorney, Agent, or Firm* — Dorsey & Whitney LLP

(57) ABSTRACT

An example method may be used to perform concurrent compensation in a memory array. The example method may include decoding a prime row address corresponding to a respective prime memory cell row of a first row section of a memory array mat to provide a prime section signal, and in response to a determination that the prime row address matches a defective prime row address, providing a redundant section signal corresponding to a respective redundant memory cell row of a second row section of the memory array mat. In response to the prime section signal, initiating a first threshold voltage compensation operation on first sensing circuitry coupled to the first row section; and in response to the redundant section signal indicating a defective prime row, initiating a second threshold voltage compensation operation on second sensing circuitry coupled to the second row section concurrent with the first threshold voltage compensation operation.

21 Claims, 4 Drawing Sheets

(56) References Cited

U.S. PATENT DOCUMENTS

| | | |
|---|---|---|
| 10,204,679 B2 | 2/2019 | Cernea |
| 11,626,154 B2 | 4/2023 | Rice et al. |
| 2002/0012282 A1* | 1/2002 | Saito ................ G11C 16/26 |
| | | 365/200 |
| 2008/0056032 A1* | 3/2008 | Tomita ............... G11C 29/02 |
| | | 365/201 |
| 2009/0201752 A1 | 8/2009 | Riho et al. |
| 2020/0227118 A1 | 7/2020 | Howe et al. |
| 2020/0312384 A1 | 10/2020 | Miyatake et al. |
| 2021/0043269 A1 | 2/2021 | He |
| 2021/0055981 A1 | 2/2021 | Miller et al. |
| 2021/0200625 A1 | 7/2021 | Park |
| 2021/0375348 A1 | 12/2021 | Lee et al. |
| 2021/0398600 A1* | 12/2021 | Jang ................... G11C 29/702 |
| 2022/0139489 A1 | 5/2022 | Rehmeyer et al. |
| 2022/0406358 A1 | 12/2022 | Akamatsu et al. |
| 2022/0406359 A1 | 12/2022 | Rice et al. |

* cited by examiner

CONCURRENT COMPENSATION IN A MEMORY SYSTEM

CROSS-REFERENCE TO RELATED APPLICATION

This application claims the filing benefit of U.S. Provisional Application No. 63/294,735, filed Dec. 29, 2021. This application is incorporated by reference herein in its entirety and for all purposes.

BACKGROUND OF THE INVENTION

High data reliability, high speed of memory access, and reduced chip size are features that are demanded from semiconductor memory. In recent years, there has been an effort to further increase the clock speed of memories without sacrificing reliability, which, for a fixed number of clock cycles, effectively reduces an absolute time period available to perform a memory operation. One area that can act as an impediment to faster clock speeds is the time it takes to charge and discharge access lines during a memory access operation. As clock speeds increase, charging and discharging of access lines may consume an increasingly larger share of allotted time to perform some memory access operations. One time period of a memory access operation that helps define a total latency within a memory to provide data from a memory cell at an output is a minimum row address (RAS) to column address (CAS) delay, or tRCD. The tRCD is a minimum number of clock cycles required between activating a row of memory and accessing a memory cell in a column of the memory cells coupled to the activated row. Reducing the tRCD may provide more margin for a memory device.

DETAILED DESCRIPTION

Figure 1:
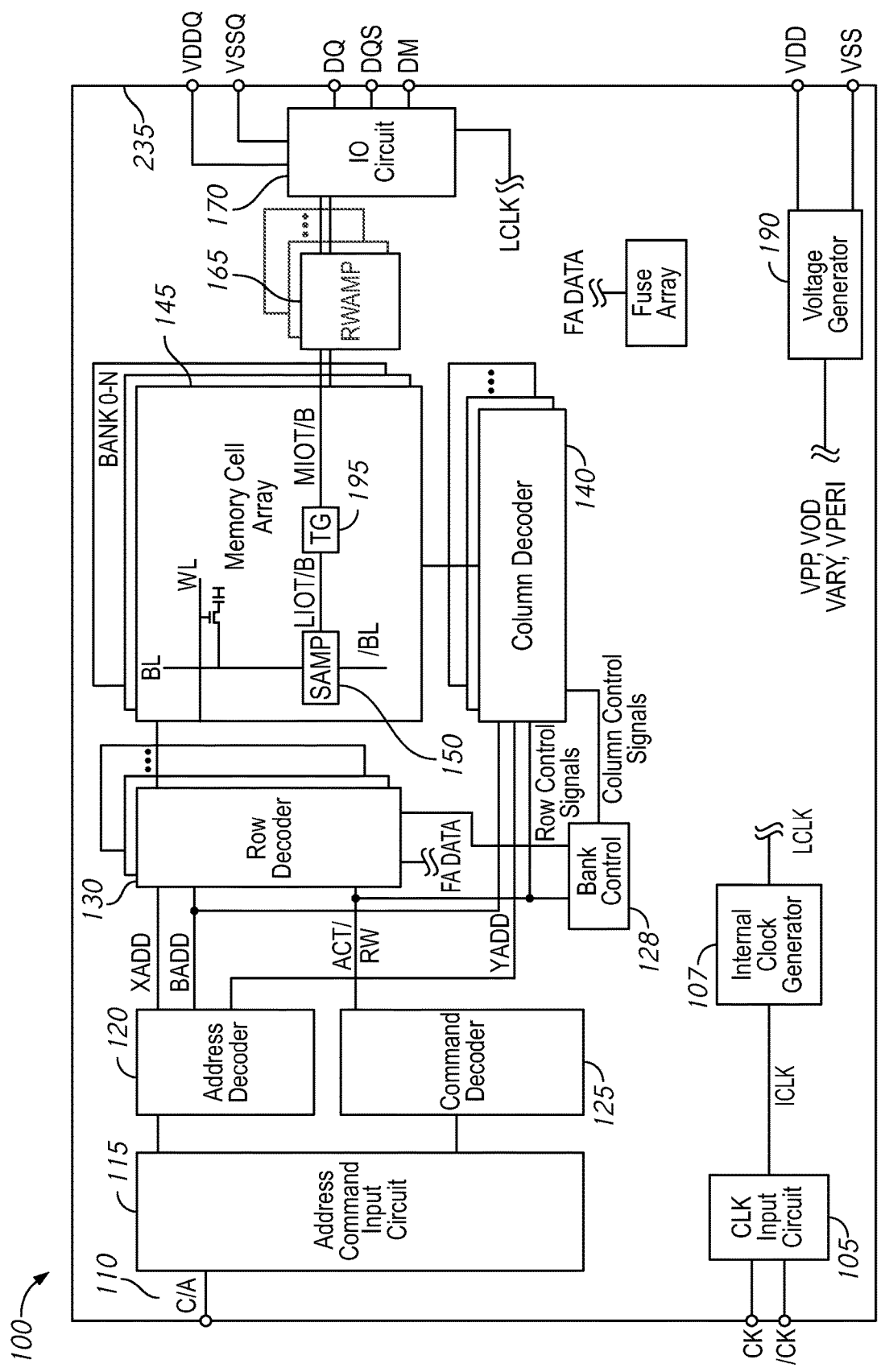
FIG. 1 is a schematic block diagram of a semiconductor device memory system, in accordance with an embodiment of the present disclosure.

This disclosure describes examples of a system to perform concurrent compensation in a memory system with distributed row redundancy. In a semiconductor memory, a memory array may be divided into banks, with each bank further divided into row sections each having a common number of rows. Some semiconductor device memories may include redundant or repair rows of memory cells within the memory array that can repair defective memory along the rows. The repair is accomplished by remapping a memory address for a primary memory location in the block of memory to a redundant memory unit, thus repairing a defective primary memory location. In some examples, the redundant rows may be distributed across the array such that some or all of the row sections have at least one repair row. In some examples, the repair row or rows in each section may be used to replace a defective row in any row section.

When a memory access (e.g., read or write) command is received, a memory may initiate a memory access operation to respond to the command. For a read operation, the memory access operation may include a chain of events (e.g., a row address (RAS) chain) to prepare the memory to retrieve the requested data from the prime or target location within the memory array, and provide the requested data to a data terminal for transmission over a data bus. One time period of a memory access operation that helps define a total latency within a memory to provide data from a memory cell at an output is a minimum RAS to column address (CAS) delay, or tRCD. The tRCD is a minimum number of clock cycles required between activating a row of memory and accessing a memory cell in a column of the memory cells coupled to the activated row.

In some examples, part of the RAS chain may performing threshold voltage compensation in sense amplifiers used to sense data stored in the memory cell. Sense amplifiers that include threshold voltage compensation circuitry may compensate for threshold voltage differences between components of the sense amplifier. Compensating for threshold voltage differences between circuit components of the sense amplifiers may improve reliability. However, a process for compensating for the threshold voltage differences may increase the tRCD, as adding a compensation phase to a sense operation may increase a total time to complete the sense operation.

When a read command is received, the memory may decode the corresponding prime or target row address received with the read command and may determine whether the prime row has been has been replaced with a redundant row. If so, the memory may re-direct the read command access to the row address associated with the redundant row (e.g., redundant row address). To determine whether the prime row has been replaced with a redundant row, the memory may include a redundant row logic circuit configured to compare repair row addresses stored in fuse latches for each row section. The process of determining row redundancy may delay the read access operation.

Thus, to mitigate the row redundancy delay, the memory may initiate the access operation for the prime row, including the VtC compensation operation, while row redundancy is being determined. In addition, in response to an initial detection of a redundant row address (e.g., a hit or match with the prime row address), but before the redundant row logic circuit has fully adjudicated the redundancy comparisons, the memory may also initiate an access operation, including the VtC compensation operation, for the redundant row concurrent with the VtC compensation for the prime row by providing signals over a set of individual redundancy section hit signal lines.

In response to a detected hit being fully adjudicated by the redundant row logic circuit, the redundant row logic circuit may cause the sense operation at the prime row to be halted in favor of the redundant row. In some examples, the sense operation may be halted before the wordline for the prime row is activated. If no hit is detected, then no redundancy access operation is initiated, and the prime row sense operation continues. By concurrently initiating the VtC compensation in both a prime and redundant row for a replaced row while the redundancy is being fully resolved determined, the memory may reduce tRCD for an access operation as compared to waiting to start the sense operation until after the redundancy determination is complete. In addition, skipping the concurrent VtC compensation when no redundancy row is detected may reduce power consumption as compared with always performing concurrent VtC compensation.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, a control circuit 121, a plurality of row decoders 130, a memory cell array 145 including sense amplifiers 150 and transfer gates 195, a plurality of column decoders 140, a plurality of bank control circuits 128, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and/CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes), which may be selected by the column select CS signal from the column decoders 140. In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. In some examples, the plurality of sense amplifiers 150 may include threshold voltage compensation circuitry that compensates for threshold voltage differences between components of the sense amplifier.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals for provision to the row decoders 130, the column decoders 140, and the bank control circuits 128. The bank control circuits 128 may provide row control signals and column control signals to the row decoders 130 and the column decoders 140, respectively, to control timing of operations of the RAS chain. The signals from the bank control circuits 128 may include a row command signal to select a word line, a column command signal, such as a read command or a write command, to select a bit line, etc.

Normally, when a read command is issued and a row address and a column address are timely supplied with the activation and read commands (ACT/RW), read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the ACT and write commands R/W, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

In some examples, a BANK0-N of the memory cell array 145 may be divided into row sections, with each row section having a common number of primary rows. In addition, the memory cell array 145 may further include redundant or repair rows of memory cells distributed across each row section of the memory cell array 145, which can be used to repair defective primary rows. The repair is accomplished by remapping a memory address for a primary row to a redundant memory unit. In some examples, the redundant rows may be distributed across the memory cell array 145 such that some or all of the row sections have at least one repair row. In some examples, the redundant row or rows in each row section may be used to replace a defective row in another row section.

Thus, as explained above, when a memory access (e.g., read or write) command is received, the semiconductor device may initiate a memory access operation to respond to the command. For a read operation, the memory access operation may include a chain of events (e.g., a row address (RAS) chain) to prepare the semiconductor device 100 to retrieve the requested data from the prime or target location within the memory cell array 145, and provide the requested data to a data terminal DQ for transmission over a data bus. One time period of a memory access operation that helps define a total latency within a memory to provide data from a memory cell at an output is a minimum RAS to column address (CAS) delay, or tRCD. The tRCD is a minimum number of clock cycles required between activating a row of memory and accessing a memory cell in a column of the memory cells coupled to the activated row.

When a read command is received, the command decoder 125 may provide an ACT command to the row decoder 130, the column decoder 140, and to the bank control circuits 128. In response, the bank control circuits 128 may provide row control signals and column control signals to the row decoder 130 and the column decoder, respectively. The row decoder 130 may include a predecoder circuit that is configured to decode a received prime row address XADD to determine which wordline to activate. The pre-decoder may be associated with a subset of row sections of a memory bank BANK0-N.

In addition, the row decoder 130 may include fuse latches that are configured to store defective row addresses received from a fuse array 129. In some examples, the fuse array 129 may provide fuse array data including the defective row addresses to the fuse latches of the row decoder 130 as part of a power-up or restart/reset sequence. A set of fuse latches may be allocated for each replacement row. The row decoder 130 may include row redundancy comparison logic that is configured to compare the corresponding prime or target row address received with the read command to determine whether the prime row has been has been replaced with a redundant row. If so, the row redundancy comparison logic may cause a predecoder to re-direct the read command access to the row address associated with the redundant row (e.g., redundant row address). The process of determining row redundancy may delay the read access operation.

Thus, to mitigate the row redundancy delay, the predecoder may initiate the access operation for the prime row, including the VtC compensation operation, while row redundancy is being determined. In addition, in response to an initial detection of a redundant row address (e.g., a hit or match with the prime row address), but before the row redundancy comparison logic has fully adjudicated the redundancy comparisons, the predecoder may also initiate an access operation for the redundant row, including the VtC compensation operation, concurrent with the access operation for the prime row. If a hit is detected, the output of the row redundancy comparison logic may cause the access operation of the prime row by the predecoder to be halted in favor of access of the redundant row. In some examples, the sense operation may be halted before the wordline for the prime row wordline is activated. If no hit is detected, then no activation operation may be initiated for a redundancy row, and the prime row access operation may continue. By concurrently initiating the VtC compensation in both a prime and redundant row while the redundancy is being determined, the semiconductor device 100 may reduce tRCD for an access operation as compared to waiting to start the sense operation until after the redundancy determination is complete. In addition, skipping the concurrent VtC compensation when no redundancy row is detected may reduce power consumption as compared with always performing concurrent VtC compensation.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
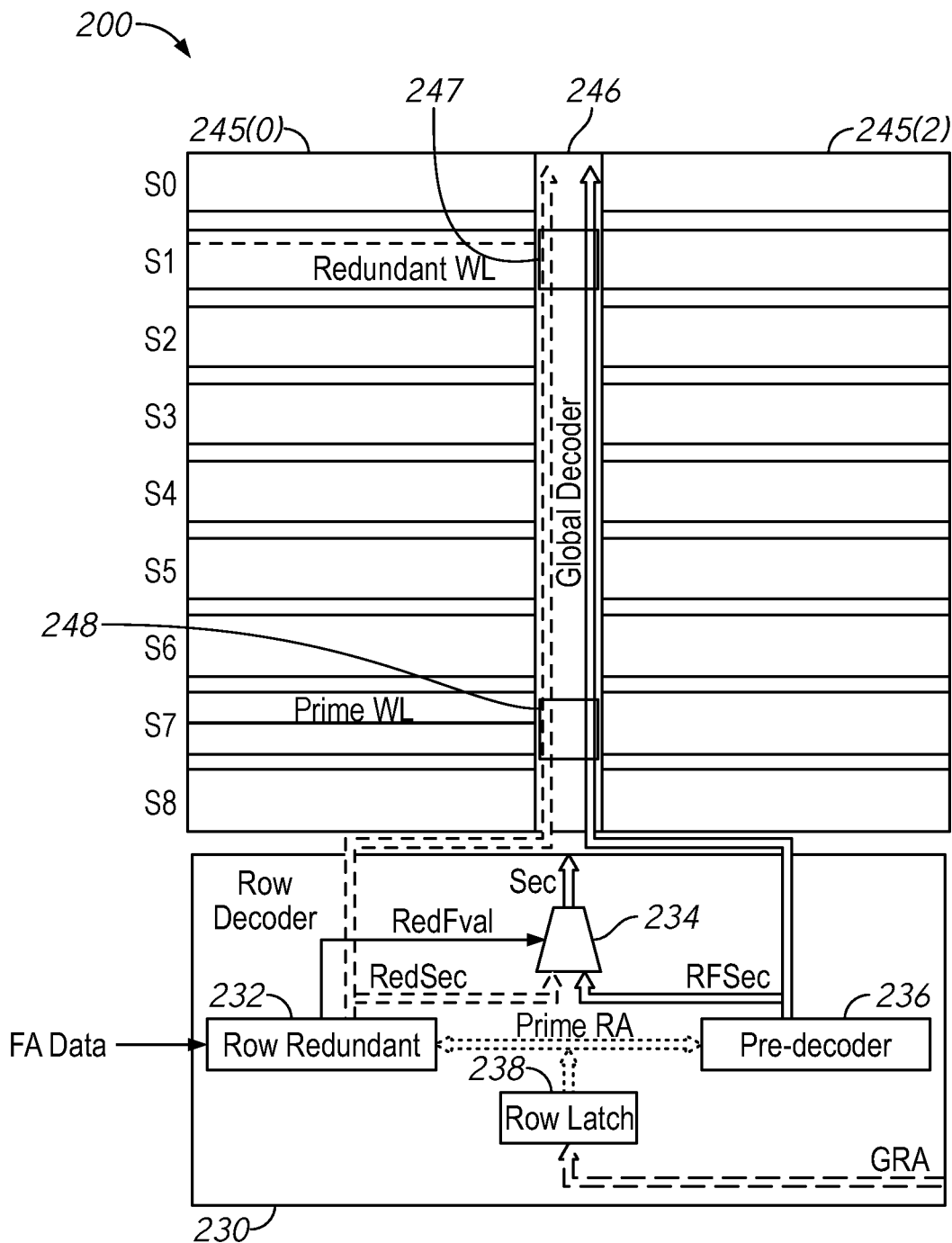
FIG. 2 is a block diagram of a semiconductor device 200, in accordance with an embodiment of the present disclosure.

FIG. 2 is a block diagram of a semiconductor device 200, in accordance with an embodiment of the present disclosure. The semiconductor device 200 may include memory array mats 245(0) and 245(2) separated by a global decoder 246 and each having respective sections S0-S8. The memory array mats may be coupled to a row decoder 230. The row decoder 230 may include a row redundant circuit 232, a multiplexer 234, a predecoder 236, and a row address latch 238. In some examples, the semiconductor device 100 of FIG. 1 may implement the semiconductor device 200.

The example memory array mats 245(0) and 245(2) shown in FIG. 2 may each include 9 row sections S0-S8, with each row section having a respective plurality of memory cell rows. It is appreciated that a memory array mat may include more or fewer row sections without departing from the scope of the disclosure. The respective plurality of memory cell rows in each row section S0-S8 may include a combination of prime memory cell rows and at least one redundant memory cell row. Each respective redundant row of the row sections S0-S8 may be associated with a respective set of fuses of a fuse array. The set of fuses for each redundant row may be configured to store a respective defective row address when a redundant row in that section has been allocated to replace the defective row of memory cells associated with the defective row address. During an initialization operation, fuse array (FA) data, including defective row addresses programmed in the respective sets of fuses for one or more of the redundant rows may be read from a fuse array and stored in a set of latches of the row redundant circuit 232.

The row decoder 230 may be configured to receive a global row address and latch the global row address at the row address latch 238 as a prime row address. The predecoder 236 may receive the prime row address from the row address latch 238 (along with other control signals) and may decode the prime row address to provide a row factor section enable signal RFSec. The RFSec signal may be provided to the multiplexer 234 and to section control circuits of the global decoder 246. For example, each of the rows sections S0-S8 may be coupled to the respective control circuits to perform access operations, such as a section control circuit 247 coupled to the row section Si and a section control circuit 248 coupled to the row section S7. The control circuits coupled to the other row sections are not depicted in FIG. 2 for clarity. The RFSec signal provided directly to the global decoder 246 may have a bus width equal to a number of the row sections S0-S8 (e.g., one signal line per row section). In response to the value of the RFSec signal a respective one of the control circuits of the global decoder 246 corresponding to the row section S0-S8 that includes the prime row may cause sensing circuitry coupled to the prime row to start a voltage compensation operation.

The row redundant circuit 232 may receive and decode the prime row address from the row address latch 238 to perform a comparison with latched FA data to determine whether the row corresponding to the prime row address has been replaced by a redundant row address in one of the row sections S0-S8. In response to detection of a hit (e.g., a match between the prime row address and an address received via the FA data), the row redundant circuit 232 may set the redundant section signal RedSec to identify a section having the redundant row. The RedSec signal provided directly to the global decoder 246 may have a bus width equal to a number of row sections. If no hit is detected, then the RedSec signal may remain in a deactivated state. The RedSec signal may be provided to the multiplexer 234 and the respective control circuits of the global decoder 246. In response to the value of the RedSec signal indicating a hit, a respective one of the control circuits of the global decoder 246 corresponding to the row section S0-S8 that includes the redundant row may cause sensing circuitry coupled to the redundant row to start a voltage compensation operation. If the RedSec signal indicates no hit was detected, then no redundant row voltage compensation operation may be initiated.

Once the row redundant circuit 232 completes a full redundancy comparison, the row redundant circuit 232 may set the redundancy evaluation signal RedEval to cause the multiplexer 234 to provide one of the RFSec or the RedSec as a section enable signal Sec. For example, when the row redundant circuit 232 detects no hit (e.g., the row associated with the global row address has not been replaced by a redundant row), the row redundant circuit 232 may set the RedEval signal to cause the multiplexer 234 to provide the RFSec signal as the Sec signal. When the row redundant circuit 232 detects a hit (e.g., the row associated with the global row address has been replaced by a redundant row), the row redundant circuit 232 may set the RedEval signal to cause the multiplexer 234 to provide the RedSec signal as the Sec signal. In this case, the voltage compensation operation started on the sensing circuitry coupled to the prime row may be stopped, while the access operation on the redundant row may continue.

In operation, fuse latches of the row redundant circuit 232 may latch defective row addresses and corresponding replacement row addresses that are received via the FA data (e.g., during a power up, initialization, or reset operation or sequence). When a read command targeting a prime row of one of the memory array mat 245(0) or 245(2) is issued, the global row address is provided to the row decoder 230 and latched at the row address latch 238 as the prime row address. In the example of FIG. 2, the prime row identified by the prime row address is shown in row section S7 of the memory array mat 245(0). The row redundant circuit 232 and the predecoder 236 may decode the prime row address to identify the prime row. In response to identification of the prime row address, the predecoder 236 may set the RFSec signal to a value activating the section control circuit 248 associated with the row section S7. In response to the RFSec signal, the section control circuit 248 may initiate a threshold voltage compensation operation for sense amplifiers coupled to the prime row.

In parallel with decoding of the prime row address by the predecoder 236, the row redundant circuit 232 may compare the prime row address with latched defective row addresses. When a match or hit is initially detected, the row redundant circuit 232 may identify the replacement row. In the example of FIG. 2, the replacement row identified by the row redundant circuit 232 is shown in row section Si of the memory array mat 245(0). In response to an initial identification of the replacement row, the row redundant circuit 232 may set the RedSec signal to a value activating the section control circuit 247 associated with the row section Si. In response to the RedSec signal, the section control circuit 247 may initiate a threshold voltage compensation operation for sense amplifiers coupled to the redundant row.

After the full prime row address comparison with the fuse array data is complete, the row redundant circuit 232 may set the RedEval signal to provide one of the RFSec signal or the RedSec signal as the SecEn signal. The RedEval signal may be based on whether there is a hit or match indicating that the prime row address is associated with a defective row of memory cells. For example, when the row redundant circuit 232 detects no hit, the row redundant circuit 232 may set the RedEval signal to cause the multiplexer 234 to provide the RFSec signal as the Sec signal. When the row redundant circuit 232 detects a hit, the row redundant circuit 232 may set the RedEval signal to cause the multiplexer 234 to provide the RedSec signal as the Sec signal. In this case, the voltage compensation operation started on by the section control circuit 248 may be stopped, while the access operation started by the section control circuit 247 may proceed.

Initiating the threshold voltage compensation operation on the redundant row when a hit is detected may reduce tRCD, may limit additional power consumption to cases where a defective row is detected (e.g., no redundant row threshold voltage compensation initiated when not hit is detected), and may be implemented without additional predecoders. In addition, by grouping all of the fuse latches together in the row decoder, the die size may be smaller as compared to implementations where the row latches are spread across the die. Lastly, by making the row latch 238 local to the array, the power consumption required to operate the row latch may be reducated as compared with non-local implementations.

Figure 3:
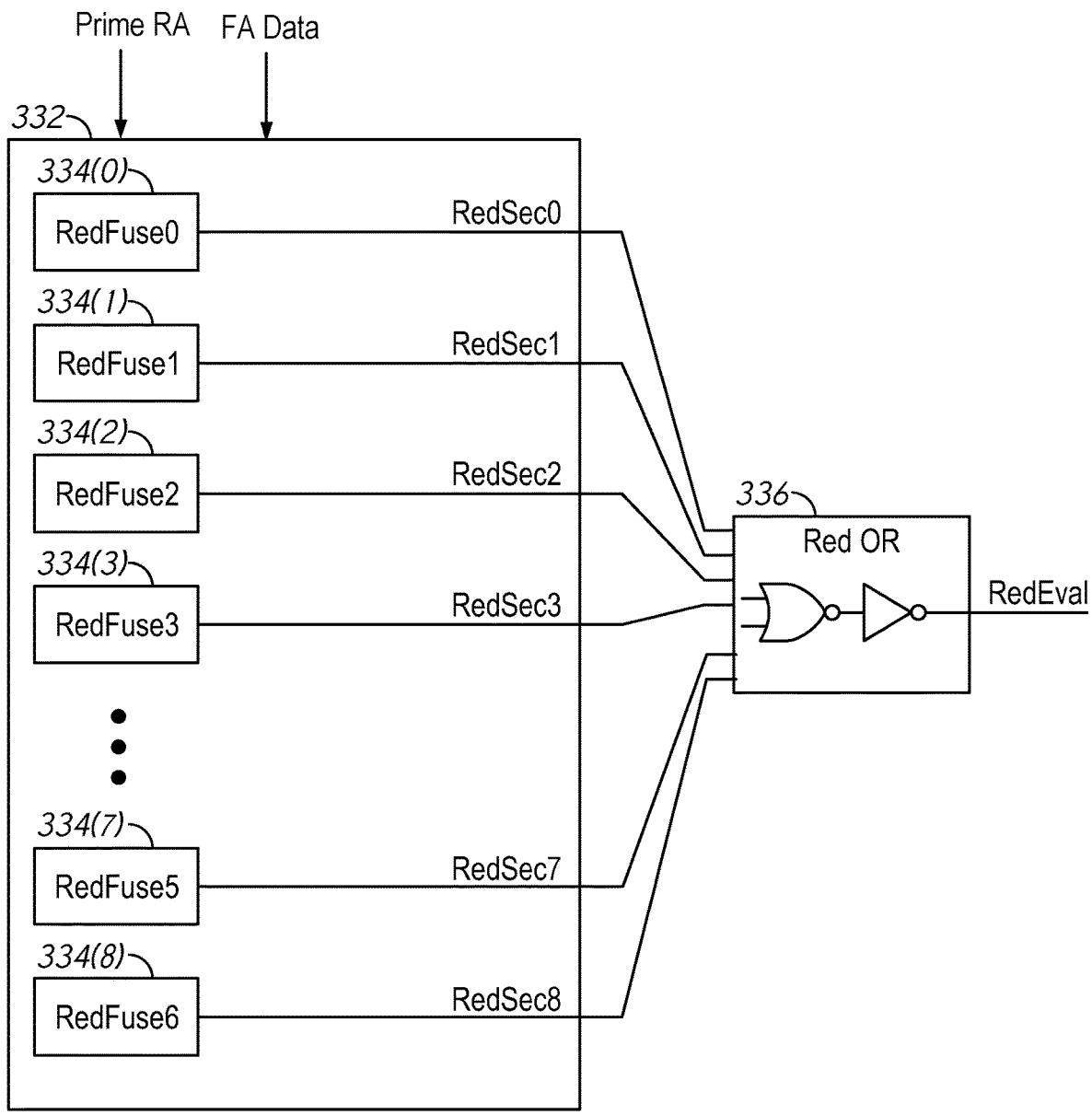
FIG. 3 is a block diagram of a row redundant circuit 300, in accordance with an embodiment of the present disclosure.

FIG. 3 is a block diagram of a row redundant circuit 300, in accordance with an embodiment of the present disclosure. The row redundant circuit 300 may include a redundant row comparison circuit 332 and an OR gate 336. In some examples, the row decoders 130 of FIG. 1 and/or the row redundant circuit 232 of FIG. 2 may implement the row redundant circuit 300.

The redundant row comparison circuit 332 may include redundant fuse latches and comparators 334(0)-(8) each associated with a particular redundant row and configured to store defective row addresses received via fuse array data from a fuse array. During an initialization operation, the redundant fuse latches and comparators 334(0)-(8) may each be configured to store a respective defective row address when the respective redundant row associated with a particular one of the redundant fuse latches and comparators 334(0)-(8) has been allocated to replace a defective row of memory cells associated with the defective row address. If a particular redundant row has not been allocated to replace a defective row, the corresponding one of the redundant fuse latches and comparators 334(0)-(8) may store a default defective row address value indicating the redundant row is unused.

Each of the redundant fuse latches and comparators 334(0)-(8) may receive and decode a prime row address to perform a comparison with a respective latched defective row address to determine whether the row corresponding to the prime row address has been replaced by a redundant row address. In response to detection of a hit (e.g., a match between the prime row address and an address received via the FA data), the corresponding one of the redundant fuse latches and comparators 334(0)-(8) may set a respective one of the redundant section signals RedSec0-8 signals to identify a row section having the redundant or replacement row.

If no hit is detected, then the RedSec0-8 signals may remain in a deactivated state. Each of the RedSec0-8 signals may be provided directly to a global decoder to cause a threshold voltage operation to be initiated in a particular replacement row section when a hit is initially detected.

The RedSec0-8 signals may further be provided to an OR gate 336. The OR gate 336 includes an OR gate (e.g., a NAND gate coupled in series with an inverter) to perform a bitwise OR operation on the RedSec0-8 signals to set a redundancy evaluation signal RedEval. Thus, when the redundant fuse latches and comparators 334(0)-(8) of the redundant row comparison circuit 332 all complete the full redundancy comparison, the OR gate 336 may set the RedEval to control whether the prime row is activated or a redundant row is activated according to the RedSec0-8 signals. For example, when the redundant fuse latches and comparators 334(0)-(8) detect no hit (e.g., the prime row associated with the prime row address has not been replaced by a redundant row), the OR gate 336 may set the RedEval signal to cause the prime row associated with the prime row address to be activated. When the redundant fuse latches and comparators 334(0)-(8) detect a hit (e.g., the prime row associated with the prime row address has been replaced by a redundant row), the OR gate 336 may set the RedEval signal to cause a respective replacement row to be activated. In this case, a voltage compensation operation started on the sensing circuitry coupled to the prime row may be stopped, while the access operation on the redundant row may continue.

Figure 4:
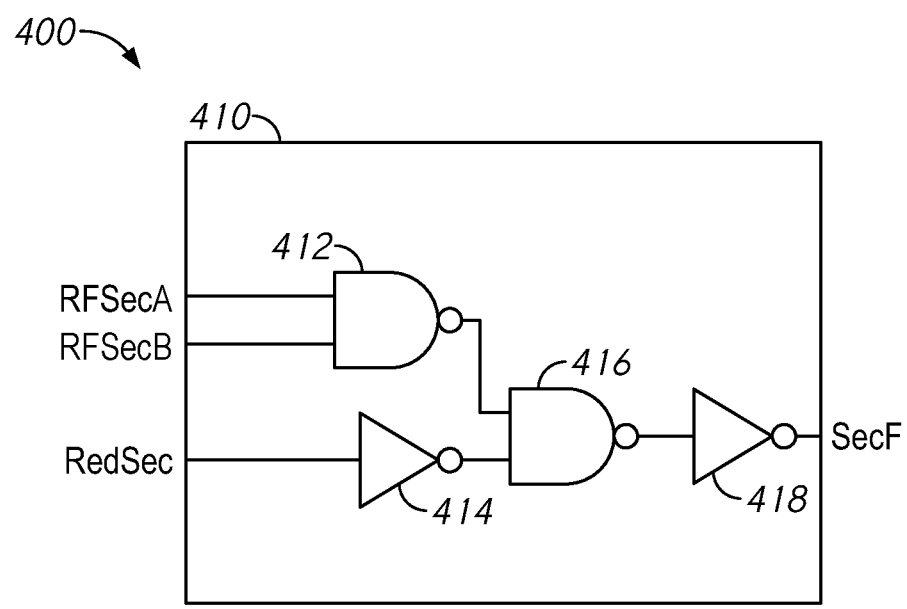
FIG. 4 is a block diagram of a portion of a section control circuit 400, in accordance with an embodiment of the present disclosure.

FIG. 4 is a block diagram of a portion of a section control circuit 400, in accordance with an embodiment of the present disclosure. The portion of the section control circuit 400 may include a section enable circuit 410 having a NAND gate 412, an inverter 414, a NAND gate 416 and an inverter 418. The section control circuit 400 may be implemented in the control circuits of the global decoder 246 of FIG. 2, including either of the section control circuit 247 or the section control circuit 248, in some examples.

The section enable circuit 410 may receive row factor section signals RFSecA/B (e.g., from a predecoder, such as the row redundant circuit 232 of FIG. 2) and a redundancy section signal RedSecX from a row redundant circuit, such as the row redundant circuit 232 of FIG. 2 or the redundant row comparison circuit 332 of FIG. 3). The NAND gate 412 may apply NAND logic between the RFSecA/B signals to provide a first input to the NAND gate 416. The inverter 414 may invert the RedSecX signal to provide a second input to the NAND gate 416. The NAND gate 416 and the inverter 418 may apply bitwise OR logic to the outputs of the NAND gate 412 and the inverter 414 to provide an active low section signal SecF.

For example, if the section control circuit 400 corresponds to a prime row associated with a prime row address, the RFSecA/B signals may be set, while the RedSecX signal may be cleared. In response, the SecF signal may be set low to initiate a threshold voltage compensation operation on sensing circuitry coupled to the prime row. If the section control circuit 400 is corresponds to an active redundant row that replaces the defective prime row associated with the prime row address, the RFSecA/B signals may be cleared, while the RedSecX signal may be set. In response, the SecF signal may be set low to initiate a threshold voltage compensation operation on sensing circuitry coupled to the redundant row. Otherwise, the SecF signal may remain high to prevent initiation of any threshold voltage compensation operations.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
a first memory region including a first memory cell mat including a first plurality of prime memory cells and a first plurality of redundant memory cells, a first sense amplifier coupled to each of the first plurality of prime memory cells and the first plurality of redundant memory cells;
a second memory region including a second memory cell mat including a second plurality of prime memory cells and a second plurality of redundant memory cells, a second sense amplifier coupled to each of the second plurality of prime memory cells and the second plurality of redundant memory cells;
a global row decoder coupled in common to the first and second memory regions, the global row decoder configured, in response to receipt of a first defective row address signal corresponds to a row of the first plurality of prime memory cells, to activate each of the first sense amplifier and the second sense amplifier; and
a row decoder configured, in response to receipt of the first defective row address signal, to provide a first prime section signal corresponding to the first plurality of prime memory cells to the global row decoder such that the first sense amplifier is activated, and to provide a second redundant section signal corresponding to the second plurality of redundant memory cells to the global row decoder such that the second sense amplifier is activated and a row of the second plurality of redundant memory cells is selected.

2. The apparatus of claim 1, wherein the first sense amplifier is configured to perform a threshold compensation when the first sense amplifier is activated, and the second sense amplifier performs a threshold compensation when the second sense amplifier is activated.

3. The apparatus of claim 1, wherein the row decoder is further configured, when receives the first defective row address signal, to activate a row of the second plurality of redundant memory cells and inhibit activation of a row of the first plurality of prime memory cells.

4. The apparatus of claim 1, wherein the row decoder comprises a predecoder configured to decode the first defective row address signal to set the first prime section signal.

5. The apparatus of claim 1, wherein the global row decoder comprises a first section control circuit configured to control activation of the first sense amplifier in response to the first prime section signal and a second section control circuit configured to control activation of the second sense amplifier in response to the second redundant section signal.

6. The apparatus of claim 1, wherein the row decoder is configured to provide one of the first prime section signal or the second redundant section signal as a final section signal; wherein the first section control circuit is configured to stop activation of the first sense amplifier in response to the final section signal being the second redundant section signal.

7. The apparatus of claim 1, wherein row decoder is configured to provide the first prime section signal and the second redundant section signal to the global decoder prior to the section signal.

8. The apparatus of claim 1, wherein the row decoder includes fuse data latches configured store defective row addresses, wherein the row decoder is configured to compare the first defective row address to the stored defective row addresses to select the second redundant section signal.

9. The apparatus of claim 1, wherein the row decoder includes a row latch configured to latch the first defective row address signal.

10. The apparatus of claim 1, wherein the global row decoder is further configured, in response to receipt of a first non-defective row address signal corresponds to another row of the first plurality of prime memory cells, to activate the first sense amplifier without activating the second sense amplifier.

11. An apparatus comprising:
a memory cell array comprising a mat having a plurality of row sections, wherein each of the plurality of row sections includes respective prime memory cell rows and a respective redundant memory cell row; and
a global decoder comprising a plurality of control circuits each corresponding to a respective one of the plurality of row sections and each configured to receive a respective prime section signal and a respective redundant section signal from a row decoder, wherein, in response to the respective prime section signal, a first corresponding control circuit of the plurality of control circuits is configured to initiate a first threshold voltage compensation operation on first sensing circuitry coupled to a first respective one of the plurality of row sections, wherein, in response to the respective redundant section signal indicating a defective prime row, a second corresponding control circuit of the plurality of control circuits is configured to initiate a second threshold voltage compensation operation on second sensing circuitry coupled to a second respective one of the plurality of row sections concurrent with the first threshold voltage compensation operation.

12. The apparatus of claim 11, wherein the plurality of control circuits are each further configured to receive a respective section signal set based on detection of the defective prime row; wherein, in response to the respective section signal indicating the defective prime row, the first corresponding control circuit of the plurality of control circuits is configured to stop the first threshold voltage compensation operation.

13. The apparatus of claim 12, wherein in response to the respective section signal indicating a lack of defective prime row, the first corresponding control circuit of the plurality of control circuits is configured to continue the first threshold voltage compensation operation.

14. The apparatus of claim 12, wherein the plurality of control circuits are configured to receive the respective section signal after receipt of the respective prime section signal and the respective redundant section signal.

15. The apparatus of claim 12, further comprising a row decoder configured to receive a prime row address and to decode the prime row address to provide the respective prime section signal, wherein the prime row address corresponds to a respective prime row of memory cells of the first respective one of the plurality of row sections.

16. The apparatus of claim 15, wherein, in response to a determination that the prime row address matches the defective prime row address, the row decoder is further configured to provide the respective redundant section signal corresponding to the second corresponding control circuit of the plurality of control circuits.

17. A method comprising:
decoding, at a row decoder of a memory, a prime row address to provide a prime section signal, wherein the prime row address corresponds to a respective prime memory cell row of a first row section of the plurality of row sections of a memory array mat;
in response to a determination that the prime row address matches a defective prime row address, providing a redundant section signal corresponding to a respective redundant memory cell row of a second row section of the plurality of row sections of the memory array mat;
in response to the prime section signal, initiating, via a first section control circuit of a global decoder, a first threshold voltage compensation operation on first sensing circuitry coupled to the first row section; and
in response to the redundant section signal indicating a defective prime row, initiating, via a second section control circuit of the global decoder, a second threshold voltage compensation operation on second sensing circuitry coupled to the second row section concurrent with the first threshold voltage compensation operation.

18. The method of claim 17, further comprising:
after initiation of the first and second threshold voltage compensation operations, providing one of the prime section signal or the redundant section signal as a section signal to the first and second section control circuits based on whether or not the prime row address matches the defective prime row address; and
in response to the section signal being the redundant section signal, stopping the threshold voltage compensation operation.

19. The method of claim 18, further comprising, in response to the section signal being the prime section signal, continuing the first threshold voltage compensation operation.

20. The method of claim 17, further comprising clearing the redundant section signal in response a determination that the prime row address is different than the defective prime row address.

21. The method of claim 17, further comprising receiving, at the row decoder, the defective row address from fuse array data during an initialization operation.

* * * * *